United States Patent
Tu et al.

(10) Patent No.: US 6,833,578 B1
(45) Date of Patent: Dec. 21, 2004

(54) METHOD AND STRUCTURE IMPROVING ISOLATION BETWEEN MEMORY CELL PASSING GATE AND CAPACITOR

(75) Inventors: Kuo-Chi Tu, Hsin-Chu (TW);
Chun-Yao Chen, Hsin-Chu (TW);
Huey-Chi Chu, Hsinchu (TW);
Chung-Wei Chang, Hsin-Chu (TW);
Tien-Lu Lin, Hsinchu (TW);
Kuo-Ching Huang, Kaohsiung (TW);
Wen-Cheng Chen, Hsin-Chu (TW);
Tsung-Hsun Huang, Taipei County (TW); Hsiao-Hui Tseng, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/733,216

(22) Filed: Dec. 11, 2003

(51) Int. Cl.⁷ ............................................. H01L 27/108
(52) U.S. Cl. ........................ 257/301; 257/300; 257/532
(58) Field of Search ................................. 257/301, 300, 257/532

(56) References Cited

U.S. PATENT DOCUMENTS

| | | | |
|---|---|---|---|
| 5,583,077 A | 12/1996 | Wang et al. | |
| 5,702,986 A | 12/1997 | Matthews et al. | |
| 5,821,139 A | 10/1998 | Tseng | |
| 5,950,084 A | * 9/1999 | Chao | 438/244 |
| 6,136,688 A | 10/2000 | Lin et al. | |
| 6,221,794 B1 | 4/2001 | Pangrle et al. | |
| 6,256,248 B1 | 7/2001 | Leung | |
| 6,287,962 B1 | 9/2001 | Lin | |
| 6,362,041 B1 | 3/2002 | Wang et al. | |
| 6,414,376 B1 | 7/2002 | Thakur et al. | |
| 6,420,226 B1 | 7/2002 | Chen et al. | |
| 6,468,855 B2 | 10/2002 | Leung et al. | |
| 6,661,050 B2 | * 12/2003 | Tzeng et al. | 257/301 |

* cited by examiner

Primary Examiner—David Nelms
Assistant Examiner—Tu-Tu Ho
(74) Attorney, Agent, or Firm—Haynes and Boone, LLP

(57) ABSTRACT

A memory cell comprising a capacitor having a dielectric layer interposing first and second vertically disposed electrodes, an insulating lining located over the capacitor, and a transistor gate extension passing over the capacitor. A spacer isolates an end of one of the capacitor electrodes from the transistor gate extension. In one embodiment, the spacer includes a first non-planar profile configured to engage a second non-planar profile comprising ends of the one of the capacitor electrodes and the insulating lining.

21 Claims, 5 Drawing Sheets

# METHOD AND STRUCTURE IMPROVING ISOLATION BETWEEN MEMORY CELL PASSING GATE AND CAPACITOR

BACKGROUND OF THE INVENTION

The present invention relates generally to memory cells and, more specifically, to methods and structure for improving electrical isolation between a memory cell transistor gate and a memory cell capacitor.

Semiconductor device geometries continue to dramatically decrease in size since such devices were first introduced several decades ago. Today's fabrication plants are routinely producing devices having feature dimensions less than 90 nm. However, solving the problems associated with implementing new process and equipment technology while continuing to satisfy device requirements has become an ever more daunting challenge.

For example, integrating the manufacture of static-random-access-memory (SRAM) cells or other memory devices having multiple transistors with other developing fabrication technologies has been troublesome, due in part to the incompatibility between process technologies. However, the process technology incompatibilities may be mitigated by employing a 1T-SRAM cell, which employs only one transistor, in contrast to the 4 or 6 transistors employed in other memory cells. Typically, a 1T-SRAM memory cell includes a transistor having the gate connected to the memory array word line, the source connected to the memory array bit line, and the drain connected to an electrode of a capacitor. This elemental cell structure can be easily scalable, and its design and manufacture can be very cost effective. Moreover, the fabrication of 1T-SRAM cells is compatible with lower thermal budgets and other advantages of recent developments in memory device fabrication.

However, existing 1T-SRAM designs suffer from excessive step height. The step height or other high aspect ratio features of 1T-SRAM cells can complicate integration with existing processes and structures. For example, a gate extension typically passes over the capacitor structure in a 1T-SRAM cell to couple the gates of two or more transistors opposing the capacitor structure. The excessive step height of the capacitor structure renders achieving adequate step coverage when forming the gate extension over the capacitor structure difficult, if not impossible. Moreover, spacers employed to isolate the capacitor electrodes from the overlying gate extension are incapable of achieving the necessary step coverage to achieve reliable and repeatable isolation.

Accordingly, what is needed in the art is a memory cell, and method of manufacture thereof, that addresses the above-discussed issues of the prior art.

SUMMARY OF THE INVENTION

To address the above-discussed deficiencies of the prior art, the present disclosure provides a memory cell comprising a capacitor having a dielectric layer interposing first and second vertically disposed electrodes, an insulating lining located over the capacitor, and a transistor gate extension passing over the capacitor. A spacer isolates an end of one of the capacitor electrodes from the transistor gate extension. In one embodiment, the spacer includes a first non-planar profile configured to engage a second non-planar profile, wherein the second non-planar profile comprises ends of the one of the capacitor electrodes and the insulating lining.

The present disclosure also introduces a memory array including a plurality of capacitive elements. In one embodiment, the capacitive elements each include a dielectric layer interposing first and second vertically disposed electrodes, an insulating lining located over one of the first and second electrodes, and a spacer having a first non-planar profile configured to engage a second non-planar profile comprising ends of the one of the first and second electrodes and the insulating lining, The memory array also includes a passing gate extending over at least one of the plurality of capacitive elements and coupling ones of a plurality of transistors each adjacent ones of the plurality of capacitive elements.

A method of manufacturing a memory cell is also provided in the present disclosure. In one embodiment, the method includes forming a capacitor having two electrodes in an opening in a substrate, wherein termini of one of the electrodes extend over and substantially parallel to the substrate. A lining is formed over and conforming to a profile of the capacitor, the lining having termini interiorly offset from the termini of the one of the capacitor electrodes. A gate electrode extension is formed, passing over the capacitor. A spacer is also formed in the method, the spacer isolating a terminus of the one of the capacitor electrodes from the gate electrode extension, the spacer also including a protrusion conforming to a recess defined by one of the lining termini and the terminus of the one of the capacitor electrodes.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

The present invention is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
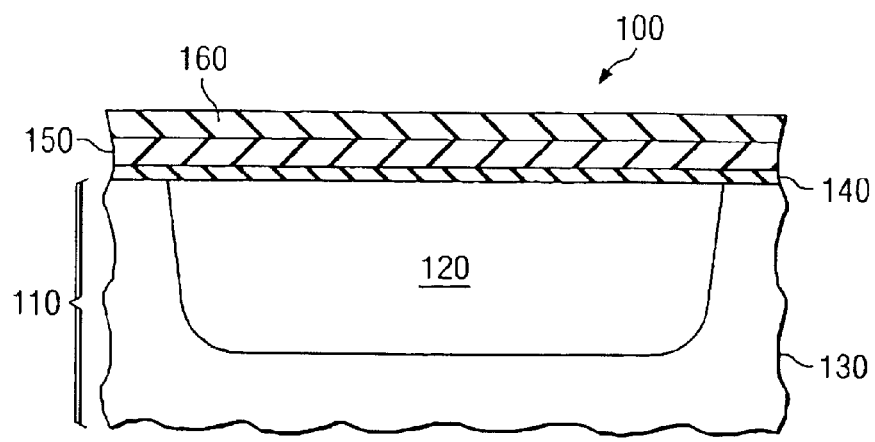
FIGS. 1–8 illustrate sectional views of one embodiment of a memory cell in various stages of manufacture according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of one embodiment of a memory cell 100 in an initial stage of manufacture according to aspects of the present disclosure. The memory cell is formed partially within a substrate 110. An isolation structure 120 may be formed in the substrate 110 by conventional or future-developed processes. The isolation structure 120 may be formed by creating an opening in the substrate 110 by plasma or dry etching, possibly employing a mask comprising photoresist or other materials, and depositing a dielectric material in the opening by chemical-vapor deposition (CVD), ionized metal plasma (IMP) deposition, metal-organic CVD (MOCVD), plasma-enhanced CVD (PECVD), atomic layer deposition (ALD), physical-vapor deposition (PVD), combinations thereof or other methods. In one embodiment, the isolation structure 120 is a shallow-trench-isolation (STI) structure, as known in the art. The isolation structure 120 may be formed in an n-type or p-type doped region 130, or well, that may be conventional in composition and manufacture, such as those employed in conventional complimentary-metal-oxide-semiconductor (CMOS) doping schemes.

A pad oxide layer 140 may be formed over the isolation structure 120 and the substrate 110. The pad oxide layer 140 may be formed by thermal oxidation, rapid thermal oxidation (RTP) and/or in-situ steam generated (ISSG) RTP. A first $Si_3N_4$ layer 150 may be formed over the pad oxide layer 140, possibly to a thickness ranging between about 60 Angstroms and about 500 Angstroms. The first $Si_3N_4$ layer 150 may be deposited by gaseous diffusion, CVD, PECVD, PVD, ALD and/or other processes. A first oxide layer 160 may be formed over the first $Si_3N_4$ layer 150. The first oxide layer 160 may have a thickness ranging between about 100 Angstroms and about 500 Angstroms, and may be formed by gaseous diffusion, CVD, PECVD, PVD, ALD and/or other processes.

Figure 2:
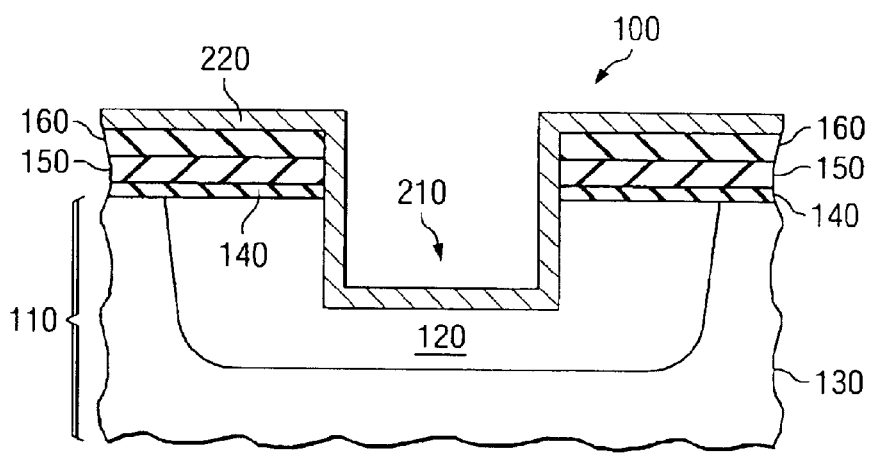

Referring to FIG. 2, illustrated is a sectional view of the memory cell 100 shown in FIG. 1 in a subsequent stage of manufacture. A trench 210 may be formed in one or more of the first oxide layer 160, the first $Si_3N_4$ layer 150, the pad oxide layer 140 and the isolation structure 120, such as by employing a mask to etch to a desired depth within the isolation structure 120, possibly by plasma or wet etching. The trench 210 may have a circular layout, such that a capacitor formed therein may have a cylindrical shape. Of course, the trench 210 (and the resulting capacitor) may have other layout shapes, such as a square, rectangle, triangle, polygon, etc.

A bottom electrode material layer 220 may then be formed over the substrate 110 and lining the trench 210, possibly by gaseous diffusion, CVD, PECVD, PVD, ALD and/or other processes. The bottom electrode material layer 220 may comprise doped or un-doped polysilicon, $HfO_2$, $ZnO_2$, $TiSi_x$, $TaSi_x$, $WSi_x$ and/or other materials. Although not illustrated as such, the bottom electrode material layer 220 may also comprise multiple layers of thin-films.

Figure 3:
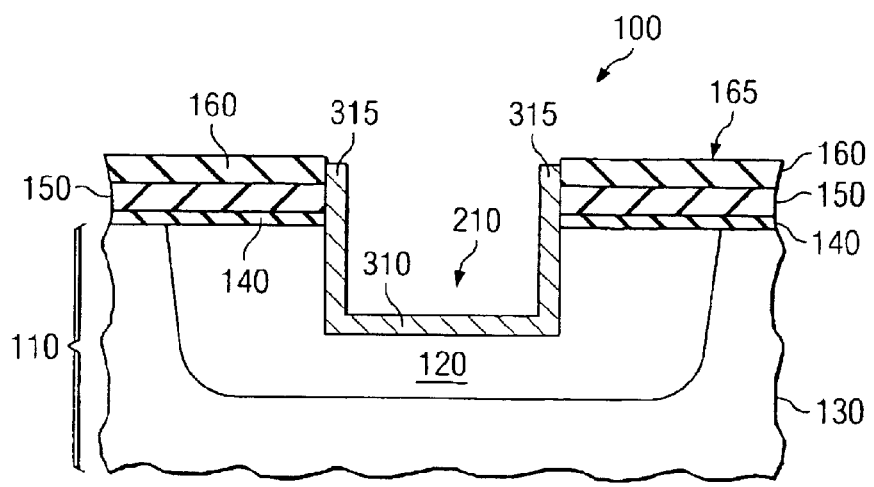

Referring to FIG. 3, illustrated is a sectional view of the memory cell 100 shown in FIG. 2 after portions of the bottom electrode material layer 220 have been removed to expose a surface 165 of the first oxide layer 160, thereby forming a bottom electrode 310. In general, the bottom electrode 310 may be thus defined by employing a dry etch process, a plasma etch process, a chemical etch process and/or a chemical mechanical polishing (CMP) process, possibly such that ends 315 of the bottom electrode 310 recede to or below the exposed surface 165 of the first oxide layer 160.

Figure 4:
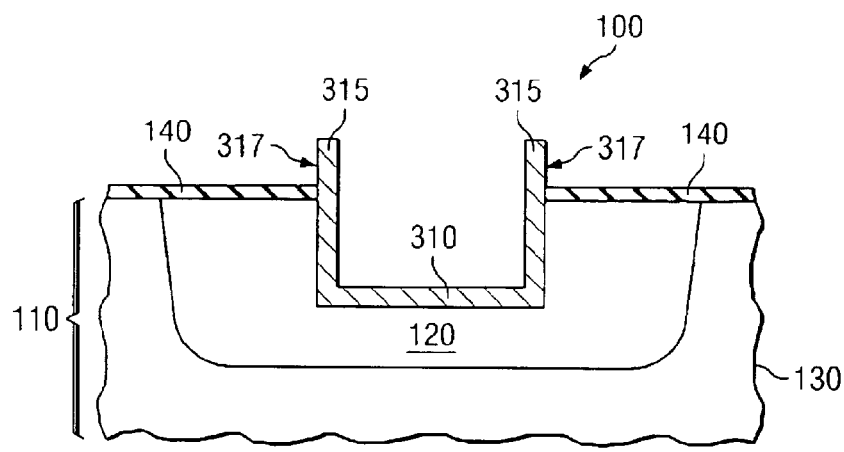

Referring to FIG. 4, illustrated is a sectional view of the memory cell 100 shown in FIG. 3 in a subsequent stage of manufacture, wherein at least portions of the first oxide layer 160 and the first $Si_3N_4$ layer 150 have been removed to expose at least portions of the pad oxide layer 140 and outer sidewalls 317 of the bottom electrode 310. The first oxide layer 160 may be removed by a chemical etch, such as with hot phosphoric acid ($H_3PO_4$). The first $Si_3N_4$ layer 150 may be chemically removed by diluted hydrofluoric (HF) acid or a buffered oxide etchant (BOE). One advantage to forming the bottom electrode 310 in the above-described manner, such that the ends 315 and portions of the sidewalls 317 of the bottom electrode 310 are exposed, is the increase in the effective surface area of the bottom electrode 310, such that the capacitor to be formed employing the bottom electrode 310 may exhibit increased capacitance values.

Figure 5:
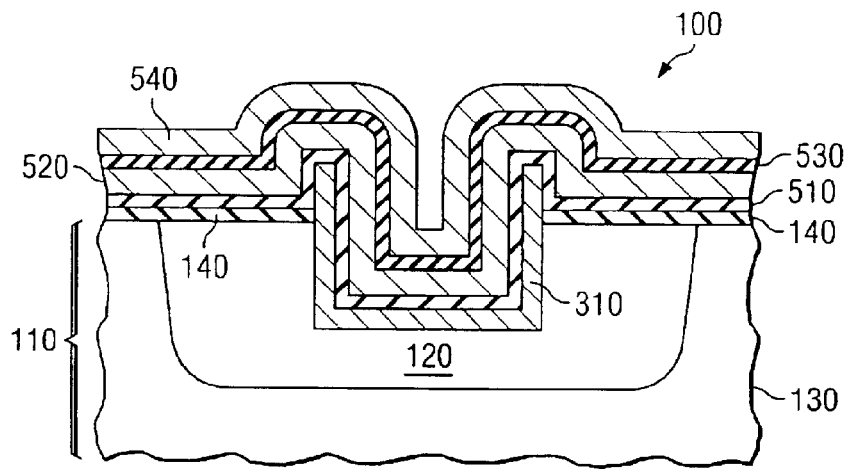

Referring to FIG. 5, illustrated is a sectional view of the memory cell 100 shown in FIG. 4 in a subsequent stage of manufacture according to aspects of the present disclosure. A capacitor dielectric material layer 510 is formed over the pad oxide layer 140 and the bottom electrode 310. The capacitor dielectric material layer 510 may comprise oxide, oxy-nitride and/or other high-k materials that may provide an effective increase in capacitance of the capacitor to be formed employing the capacitor dielectric material layer 510, such as by increasing the effective surface area by providing a rough interface or nano-surface texture. Such materials may also include bismuth titanate, lead titanate, tantalum pentoxide, hafnium oxides and/or zinc oxides.

A top electrode material layer 520 is formed over the capacitor dielectric material layer 510. The top electrode material layer 520 may comprise doped or un-doped polysilicon, CN, SiC, SiOC, $HfO_2$, $ZnO_2$, $TiSi_x$, $TaSi_x$, $WSi_x$ and/or other materials. The top electrode 108 material may be deposited by gaseous diffusion, CVD, PECVD, PVD, ALD and/or other processes. Moreover, as with the bottom electrode 310, the top electrode material layer 520 may comprise multiple layers of thin-films.

An insulating lining 530 is formed over the top electrode material layer 520. The insulating lining 530 may provide stress relief to prevent cracking or peeling that might otherwise occur as a result of subsequent thermal processing. The insulating lining 530 may comprise $SiO_2$, SiON, $Si_3N_4$, SiCO and/or other low-k materials, and may be formed by gaseous diffusion, CVD, PECVD, PVD, ALD and/or other processes, possibly to a thickness ranging between about 50 Angstroms and about 500 Angstroms.

An anti-reflective coating (ARC) layer 540 may be formed over the insulating lining 530. The ARC layer 540 may reduce the reflectivity of the top electrode material layer 520, which may prevent reflective notching during subsequent processing. The ARC layer 540 may comprise SiON, TiN, TiO and/or other organic or inorganic materials generally employed in anti-reflective coatings.

Figure 6:
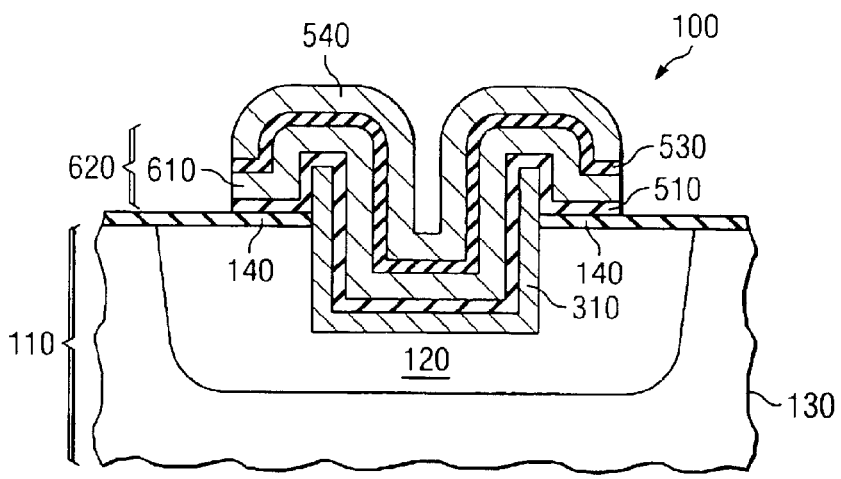

Referring to FIG. 6, illustrated is a sectional view of the memory cell 100 shown in FIG. 5 in a subsequent stage of manufacture, wherein an etching process has been employed to remove portions of the ARC layer 540, the insulating lining 530, the top electrode material layer 520 and the capacitor dielectric material layer 510. Consequently, a top electrode 610 is defined from the top electrode material layer 520. The etching process may include a chemical and/or a plasma etching process. Moreover, the etching process may be an anisotropic process, whereby termini or outer boundaries of the ARC layer 540, the insulating lining 530, the top electrode 610 and the capacitor dielectric material layer 510 may be substantially coincident, or may form a substantially planar profile 620.

Figure 7:
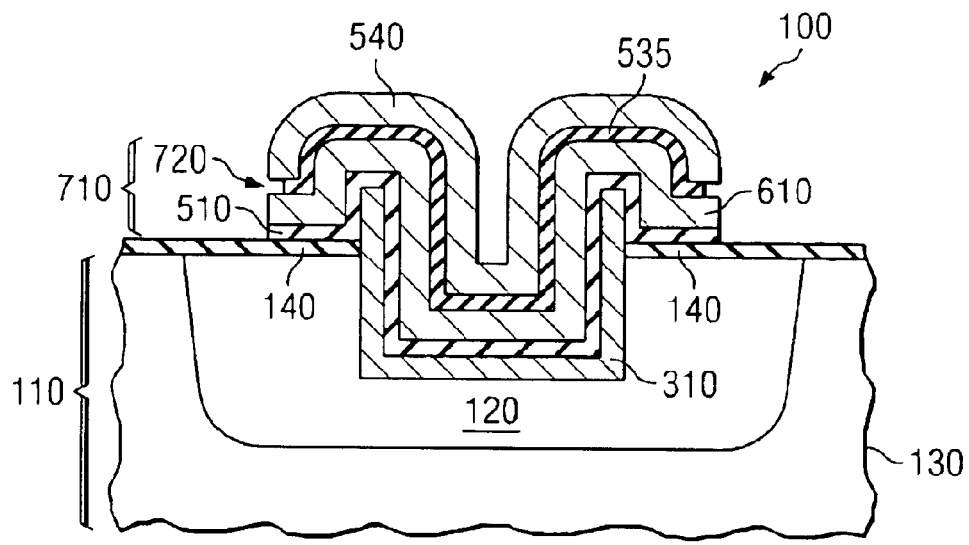

Referring to FIG. 7, illustrated is a sectional view of the memory cell 100 shown in FIG. 6 after an isotropic etch is performed. The isotropic etch may comprise a diluted HF solution or other chemistry that may be more selective to the insulating lining 530 than surrounding layers, such that the etch will cause termini 535 of the insulating lining 530 to recede inside the termini of the top electrode 610 and the ARC layer 540 and form an under-cut profile 710, in contrast to the substantially planar profile 620 shown in FIG. 6. Consequently, a gap 720 may be created by the isotropic etch. The gap 720 may extend around the structure formed over the isolation structure 120 (in and out of the page) and, as such, may have a ring or annulus shape. The gap 720 may provide additional sealing surface and volume for a subsequently formed spacer material layer 810.

Figure 8:
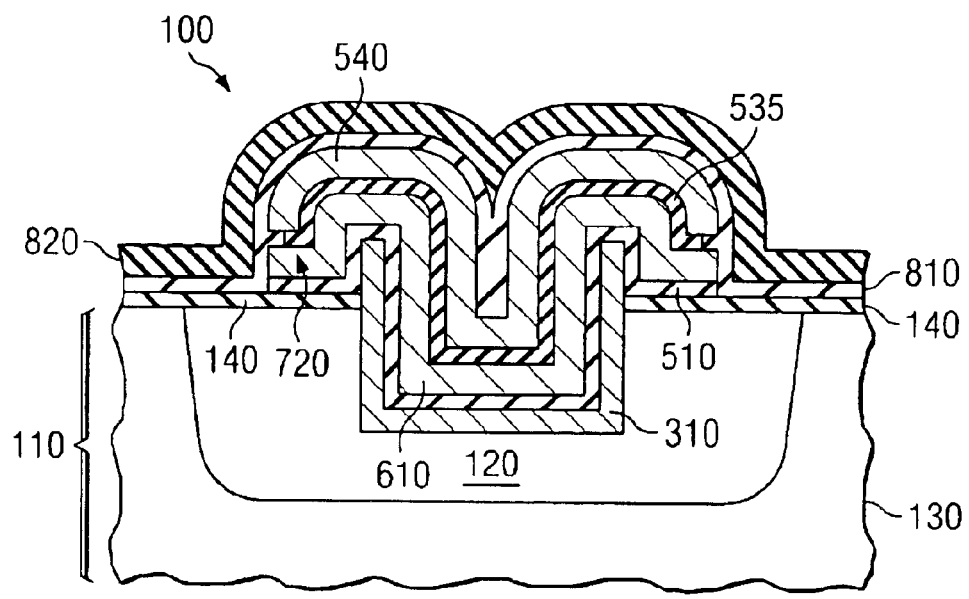

Referring to FIG. 8, illustrated is a sectional view of the memory cell 100 shown in FIG. 7 in a subsequent stage of manufacture according to aspects of the present disclosure. The first spacer material layer 810 may be formed over the structure shown in FIG. 7, including in the gap 720. The first spacer material layer 810 may comprise $Si_3N_4$, CN, SiOC, SiC, SiCN, $SiO_2$ and/or other materials, and may be formed by gaseous diffusion; CVD, PECVD, PVD, ALD and/or other processes, possibly to a thickness ranging between about 100 Angstroms and about 500 Angstroms.

A second spacer material layer 820 may be formed over the first spacer material layer 810. The second spacer material layer 820 may comprise oxide or other dielectric materials, and may be formed by gaseous diffusion, CVD, PECVD, PVD, ALD and/or other processes, possibly to a thickness ranging between about 200 Angstroms and about 700 Angstroms.

Figure 9:
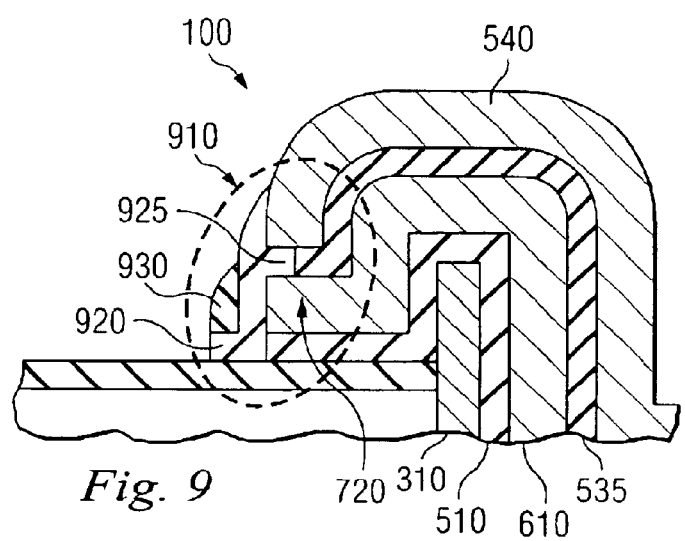
FIG. 9 illustrates a sectional view of the memory cell shown in FIG. 8 in a subsequent stage of manufacture and at an increased scale.

Referring to FIG. 9, illustrated is a sectional view of the memory cell 100 shown in FIG. 8 after undergoing an etching process to remove portions of the first and second spacer material layers 810, 820 to define a spacer 910 having a body portion 920 and a cap portion 930. The scale of FIG. 9 has been increased to demonstrate the definition of one embodiment of the spacer 910 constructed according to aspects of the present disclosure. The etch process employed to define the spacer 910 may comprise one or more plasma and/or chemical etch processes. In one embodiment, a first etch process may be employed to substantially form the cap portion 930 from the second spacer material layer 820 and a second etch process may be employed to form the body portion 920 from the first spacer material layer 810. At least in the illustrated embodiment, the spacer 910 extends away from the pad oxide layer 140 beyond the gap 720. Moreover, because the first spacer material layer 810 was formed in the gap 720, the body portion 920 of the spacer 910 includes a protrusion 925 extending into the gap 720. In the illustrated embodiment, the protrusion 925 extends from the body portion 920 a distance substantially equal to the width of the body portion 920, although the present disclosure is not limited to such an embodiment.

Figure 10:
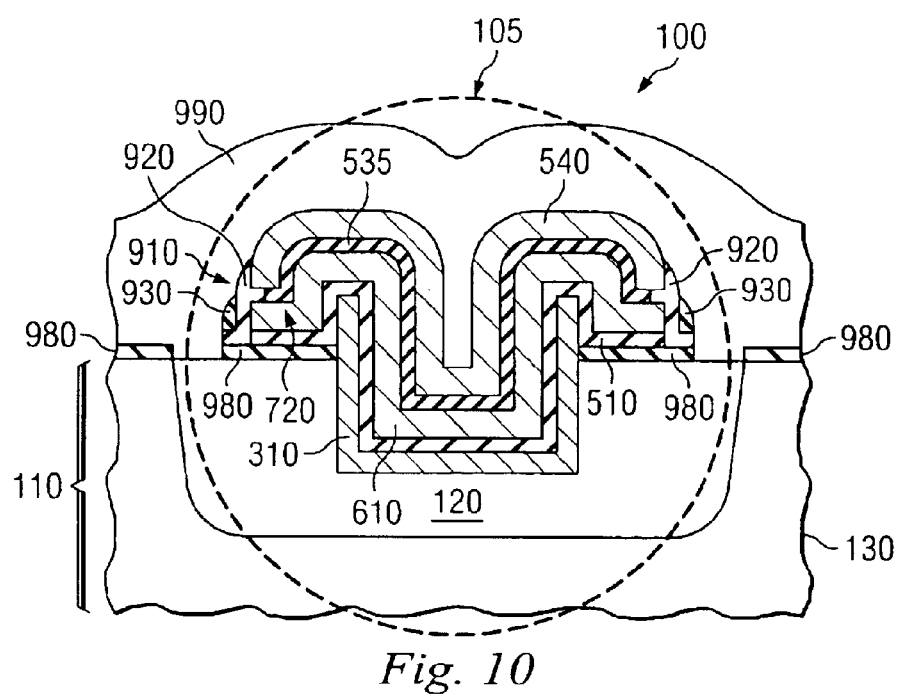
FIG. 10 illustrates a sectional view of the memory cell shown in FIGS. 1–9 in a subsequent stage of manufacture according to aspects of the present disclosure.

Referring to FIG. 10, illustrated is a sectional view of the memory cell 100 shown in FIG. 9 in a subsequent stage of manufacture. The embodiment shown in FIG. 10 may represent the memory cell 100 in a substantially completed stage, or may at least represent a substantially completed capacitive element 105. As depicted in FIG. 10, portions of the pad oxide layer 140 may be removed, such as by a diluted HF or BOE etch. Gate oxides 980 may then be formed over the substrate 110, such as by thermal oxidation, RTP, ISSG RTP and/or other oxidation processes. The gate oxides 980 may comprise nitrided oxide, possibly by employing a decoupled nitrogen plasma (DPN) or other nitridation process. A gate layer 990 may then be formed over the gate oxides 980 and the capacitive element 105. Because the gate layer 990 passes over the capacitive element 105 to interconnect individual transistors (discernable in FIG. 10 by their individual gate oxides 980), the gate layer 990 may be referred to as a passing gate.

Because the spacers 910 extend into the gap 720, the memory cell 100 is better isolated from the passing gate 990. More specifically, the top electrode 610 is better isolated from the passing gate 990 when compared to conventional 1T-SRAM cells because the spacer 910 is thicker at the portion nearest the passing gate 990. For example, as illustrated in FIGS. 9 and 10, the protrusion 925 extends from the spacer body portion 920 into the gap 720 to provide additional isolation between the passing gate 990 and the top electrode 610. Moreover, fluctuations in the etching process (es) employed to form the spacer 910 may be better tolerated and have less detrimental effect on product yield because at least a portion of the spacer 910 (e.g., the protrusion 925 of the body portion 920) is protected from the etching chemistry by the ARC layer 540 and the top electrode 610. Moreover, because the inner profile of the body portion 920 is a mirror image of or otherwise engages with the profile 710 resulting from the isotropic etch employed to form the gap 720, the mechanical strength of the spacer 910 is enhanced over that achievable with conventional processes.

Furthermore, the thickness of the spacer 910 may be achieved despite the significant step height of the memory cell 100. That is, the step height of the memory cell 100 may cause the spacer 910 to be formed relatively thin or narrow. However, because the first spacer material layer 810 may be formed in the gap 720, the passing gate 990 may remain isolated from the top electrode 610 despite a decrease in the thickness or width of the spacer 910. In addition, the advantages exhibited by incorporating aspects of the present disclosure may be achieved with existing technology and equipment, and may be readily implemented into existing fabrication procedures.

Figure 11:
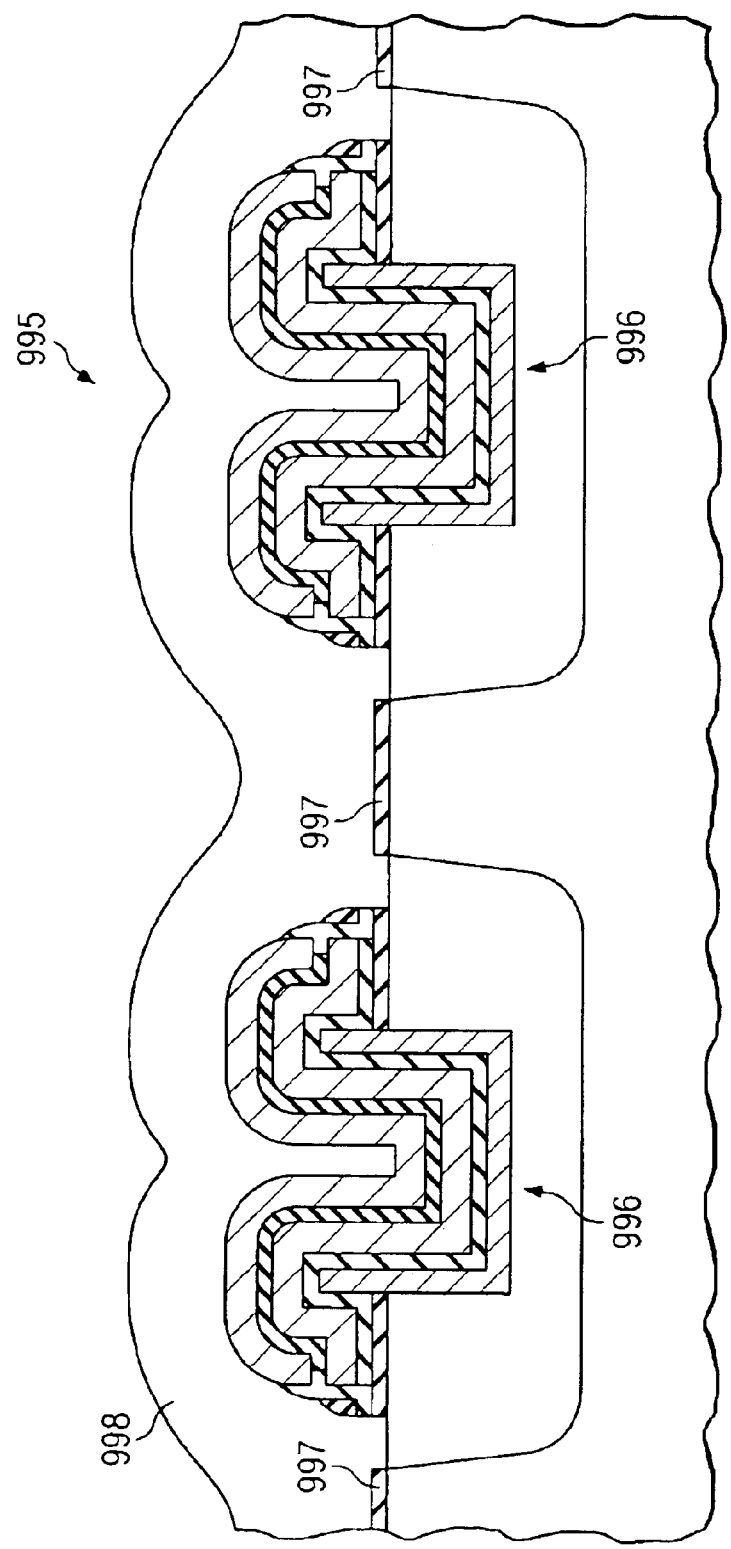
FIG. 11 illustrates a sectional view of one embodiment of a memory array constructed according to aspects of the present disclosure.

Referring to FIG. 11, illustrated is a sectional view of a memory array 995 constructed according to aspects of the present disclosure. The memory array 995 may be one environment in which the memory cell 100 and/or the capacitive element 105 shown in FIG. 10 may be implemented. The memory array 995 includes a plurality of memory cells each comprising capacitive elements 996 and transistors. Individual ones of the transistors are discernable in the illustrated embodiment by their individual gate oxides 997. One or more of the capacitive elements 996 may be substantially similar to the capacitive element 105 shown in FIG. 10. The memory array 995 also includes a gate electrode extension 998 extending over at least one of the capacitive elements 996 and coupling ones of the transistors. The gate electrode 998 may have a width (in and out of the page in FIG. 11) that is about equal to or less than 130 nm.

Although embodiments of the present disclosure have been described in detail, those skilled in the art should understand that they can make various changes, substitutions and alterations herein without departing from the spirit and scope of the present disclosure.

What is claimed is:

1. A memory cell, comprising:
   a capacitor having a dielectric layer interposing first and second vertically disposed electrodes;
   an insulating lining located over the capacitor;
   a transistor gate extension passing over the capacitor; and
   a spacer isolating an end of one of the capacitor electrodes from the transistor gate extension, the spacer having a first non-planar profile configured to engage a second non-planar profile comprising ends of the one of the capacitor electrodes and the insulating lining.

2. The memory cell of claim 1 wherein the second non-planar profile is a mirror image of the first non-planar profile.

3. The memory cell of claim 1 further comprising an anti-reflection coating (ARC) layer between at least portions of the one of the capacitor electrodes and the transistor gate extension.

4. The memory cell of claim 3 wherein the spacer includes:
   a body having a body width; and
   a protrusion extending from the body a distance substantially equal to the body width;
   wherein the second non-planar profile includes a recess formed by an offset between the ends of the one of the capacitor electrodes and the insulating lining.

5. The memory cell of claim 1 wherein the spacer includes a nitride layer and an oxide layer located over the nitride layer.

6. The memory cell of claim 1 wherein the spacer includes a silicon nitride layer and an oxide layer located over the silicon nitride layer.

7. A memory array, comprising:
   a plurality of capacitive elements each including:
      a dielectric layer interposing first and second vertically disposed electrodes;
      an insulating lining located over one of the first and second electrodes; and
      a spacer having a first non-planar profile configured to engage a second non-planar profile comprising ends of the one of the first and second electrodes and the insulating lining; and
   a passing gate extending over at least one of the plurality of capacitive elements and coupling ones of a plurality of transistors each adjacent ones of the plurality of capacitive elements.

8. A method of manufacturing a memory cell, comprising:
   forming a capacitor having two electrodes in an opening in a substrate, wherein termini of one of the electrodes extend over and substantially parallel to the substrate;
   forming a lining over and conforming to a profile of the capacitor, the lining having termini interiorly offset from the termini of the one of the capacitor electrodes;
   forming a gate electrode extension passing over the capacitor; and
   forming a spacer isolating a terminus of the one of the capacitor electrodes from the gate electrode extension, the spacer including a protrusion conforming to a recess defined by one of the lining termini and the terminus of the one of the capacitor electrodes.

9. The method of claim 8 wherein forming the lining includes depositing an electrically insulating material and isotropically etching the electrically insulating material.

10. The method of claim 8 further comprising forming an anti-reflection coating (ARC) layer over and conforming to the lining, the ARC layer having termini exteriorly offset from the lining termini.

11. The method of claim 10 wherein the lining comprises a material to which an isotropic etching process is selective, wherein the lining termini are defined by the etching process after forming the ARC layer, whereby the lining termini undercut the ARC layer termini.

12. The method of claim 10 wherein the each of the recesses defined by one of the lining termini and one of the capacitor termini is further defined by one of the ARC layer termini.

13. The method of claim 8 wherein the capacitor includes:
   a first electrode having termini protruding from the opening;
   a second electrode substantially conforming to the first electrode and the substrate; and
   a dielectric layer isolating the second electrode from the first electrode; wherein
   the lining termini are interiorly offset from termini of the second electrode.

14. The method of claim 8 wherein forming the spacers includes forming a first spacer layer and forming a second spacer layer over the first spacer layer, wherein the protrusions are integral to the first spacer layer.

15. The method of claim 14 wherein the first spacer layer comprises nitride and the second spacer layer comprises oxide.

16. The method of clam 14 wherein the first spacer layer comprises a material selected from the group consisting of:
   $Si_3N_4$;
   CN;
   SiOC;
   SiC;
   SiCN; and
   SiO2.

17. The method of claim 14 wherein at least one of the first and second spacer layers is formed by a process selected from the group consisting of:
   gaseous diffusion;
   CVD;
   PECVD;
   PVD; and
   ALD.

18. The method of claim 14 wherein the first spacer layer has a thickness ranging between about 100 Angstroms and about 500 Angstroms.

19. The method of claim 14 wherein the second spacer layer has a thickness ranging between about 200 Angstroms and about 700 Angstroms.

20. The method of claim 8 wherein the lining comprises $Si_3N_4$.

21. The method of claim 8 wherein the gate electrode extension has a width that is less than about 130 nm.

* * * * *